United States Patent
Balakrishnan et al.

(10) Patent No.: US 9,536,795 B2
(45) Date of Patent: Jan. 3, 2017

(54) MULTIPLE THRESHOLD VOLTAGE TRIGATE DEVICES USING 3D CONDENSATION

(71) Applicant: International Business Machines Corporation, Armonk, NY (US)

(72) Inventors: Karthik Balakrishnan, White Plains, NY (US); Pouya Hashemi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 12 days.

(21) Appl. No.: 14/629,552

(22) Filed: Feb. 24, 2015

(65) Prior Publication Data

US 2016/0247731 A1   Aug. 25, 2016

(51) Int. Cl.
| | | |
|---|---|---|
| *H01L 21/84* | (2006.01) | |
| *H01L 27/12* | (2006.01) | |
| *H01L 29/161* | (2006.01) | |
| *H01L 21/308* | (2006.01) | |
| *H01L 21/02* | (2006.01) | |
| *H01L 21/762* | (2006.01) | |

(52) U.S. Cl.
CPC ....... *H01L 21/845* (2013.01); *H01L 21/02164* (2013.01); *H01L 21/02236* (2013.01); *H01L 21/3081* (2013.01); *H01L 21/3083* (2013.01); *H01L 21/7624* (2013.01); *H01L 27/1211* (2013.01); *H01L 29/161* (2013.01)

(58) Field of Classification Search
CPC .................................................... H01L 21/845
USPC ....................................................... 257/531
See application file for complete search history.

(56) References Cited

U.S. PATENT DOCUMENTS

| | | | |
|---|---|---|---|
| 8,283,734 B2 | 10/2012 | Chiang et al. | |
| 8,445,345 B2 | 5/2013 | Cheng et al. | |
| 8,486,776 B2 | 7/2013 | Bedell et al. | |
| 8,716,786 B2 | 5/2014 | Baumgartner et al. | |
| 8,828,851 B2 | 9/2014 | Loubet et al. | |
| 2008/0135949 A1 | 6/2008 | Lo et al. | |
| 2011/0012090 A1 | 1/2011 | Singh et al. | |
| 2011/0147811 A1* | 6/2011 | Kavalieros ........ | H01L 29/66795 257/288 |

(Continued)

FOREIGN PATENT DOCUMENTS

| | | |
|---|---|---|
| WO | 2008069765 A1 | 6/2008 |
| WO | 2009072984 A1 | 6/2009 |

OTHER PUBLICATIONS

Guillet et al., "Unhydrogenated polycrystalline silicon-germanium thin film transistors by LPCVD", Thin Film Transistor Technologies V: Proceedings of the International Symposium, vol. 2000, 2001, p. 276.

(Continued)

*Primary Examiner* — Kenneth Parker
*Assistant Examiner* — Warren H Kilpatrick
(74) *Attorney, Agent, or Firm* — Andrew G. Wakim

(57) ABSTRACT

A method of forming a multiple threshold voltage p-channel silicon germanium trigate device using (3D) condensation. The method may include forming a first and second fin in a single semiconductor layer, where the first and second fin have similar initial widths; thinning the second fin; performing a (3D) condensation process to condense the germanium within the first and second fin; and thinning the first fin to a similar width as the second fin.

16 Claims, 3 Drawing Sheets

(56) References Cited

U.S. PATENT DOCUMENTS

2012/0043620 A1    2/2012  Guo et al.
2013/0102116 A1    4/2013  Xiao et al.
2015/0279684 A1*  10/2015  Wei ................. H01L 21/823431
                                                              438/424

OTHER PUBLICATIONS

Mittal et al., "Epitaxially Defined FinFET: Variability Resistant and High-Performance Technology", IEEE Transactions on Electron Devices, vol. 61, No. 8, Aug. 2014, pp. 2711-2718.

* cited by examiner

MULTIPLE THRESHOLD VOLTAGE TRIGATE DEVICES USING 3D CONDENSATION

BACKGROUND

The present invention generally relates to semiconductor device manufacturing, and more particularly to the formation of fins with multiple threshold voltages using (3D) condensation.

FinFET, Tri-Gate, and nanowire devices typically include a non-planar multiple gate transistor device. The device includes a conducting channel disposed on a silicon fin, nanowire, or similar linear structure.

Complementary metal oxide semiconductor (CMOS) devices exhibit a threshold voltage (Vt). A voltage applied to the gate of an n-type device (gate voltage) that equals or exceeds the threshold voltage induces a low resistance conductive path between the source and drain regions of the device. While a gate voltage that is below the threshold voltage results in little or no conductive path between the source and drain regions.

In electronic circuits, devices with different threshold voltages are used to realize circuit function. Previous methods of fabricating multiple devices with different threshold voltages included implanting different types of substrate dopants for FET devices that result in different threshold voltages.

SUMMARY

According to one embodiment of the present invention, a method is provided. The method may include providing a silicon-germanium-on-insulator (SGOI) substrate, the SGOI substrate includes (from bottom to top) a substrate, an insulator layer, and a SiGe layer; forming a patterned hardmask on the SiGe layer; forming a plurality of fins in the SiGe layer by etching a trench through the SiGe layer, the trench exposes a top surface of the insulator layer, the patterned hardmask protects a top surface of the plurality of fins, the plurality of fins includes a first fin and a second fin, the first fin has a first width and the second fin has a second width, and the first width is similar to the second width; trimming the second fin to a third width by etching sidewalls of the second fin, the top of the second fin is protected by the patterned hardmask, and the first fin is protected by a first fin mask; and modulating the germanium fraction of the first and second fin using a Ge-condensation process, the patterned hardmask protects the top surface of the plurality of fins, the first fin has a fourth width and the second fin has a fifth width, and the first fin has a lower germanium concentration than the second fin.

According to another embodiment of the present invention, a method is provided. The method may include forming a semiconductor-on-insulator (SOI) substrate, the SOI substrate includes (from bottom to top) a substrate, a buried oxide (BOX) layer, and a semiconductor layer; forming a plurality of fins in the semiconductor layer, the plurality of fins includes a first fin and as second fin, the first fin has a first width and the second fin has a second width, and a top surface of the plurality of fins is protected by a hardmask; thinning the second fin to a third width by removing a portion of the semiconductor layer from sidewalls of the second fin; and condensing the plurality of fins using a (3D) condensation process, the top surface of the plurality of fins is protected by the hardmask, the first fin has a fourth width and the second fin has a fifth width, the fifth width is less than the third width.

According to another embodiment of the present invention, a structure is provided. The structure may include a plurality of fins on an insulator layer, the plurality of fins includes a first fin and a second fin, the plurality of fins include SiGe, the first fin has a lower germanium fraction than the second fin.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
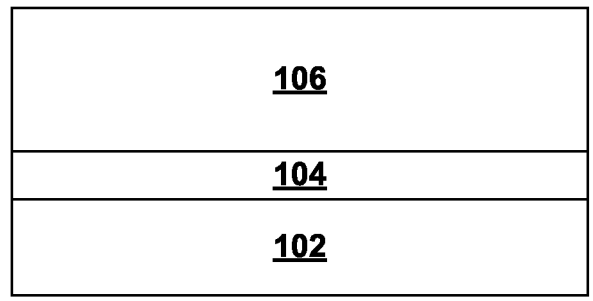
FIG. 1 is a cross section view of a semiconductor structure, according to an exemplary embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to semiconductor device manufacturing, and more particularly to the formation of fins with multiple threshold voltages using (3D) condensation. Ideally, it may be desirable to have a plurality of fins with different threshold voltages while reducing processing steps and cost. One way to fabricate a plurality of fins with different threshold voltages is to form a plurality of fins having the same germanium fraction (e.g., $Si_{1-x}Ge_x$) but having different fin widths. A (3D) condensation process (e.g., Ge-condensation) may be used to condense the germanium atoms in the fins. The germanium concentration in the fins will be different because of the different starting widths of the fins. One embodiment by which to form a plurality of fins with different germanium fractions is described in detail below referring to the accompanying drawings FIGS. 1-5.

With reference to FIG. 1, a demonstrative illustration of a structure 100 is provided during an intermediate step of a method of fabricating a plurality of fins with a modulated germanium fraction, according to an embodiment. More specifically, the method can start with a semiconductor-on-insulator (SOI) substrate.

The SOI substrate may include (from bottom to top) a substrate 102, an insulator layer 104, and a semiconductor layer 106. The substrate 102 may include; a bulk semiconductor substrate, a layered semiconductor substrate (e.g., Si/SiGe), a silicon-on-insulator substrate (SOI), or a SiGe-on-insulator substrate (SGOI). The substrate 102 may include any semiconductor material known in the art, such as, for example; Si, Ge, SiGe, SiC, SiGeC, Ga, GaAs, InAs, InP, or other elemental or compound semiconductors. The substrate 102 may include, for example; an n-type, p-type, or undoped semiconductor material and may have a monocrystalline, polycrystalline, or amorphous structure. In an embodiment, the substrate 102 is a bulk silicon substrate.

The insulator layer 104 may be formed on the substrate 102 using any deposition technique known in the art, such as, for example, epitaxial growth, chemical vapor deposition (CVD), physical vapor deposition (PVD), or atomic layer deposition (ALD). The insulator layer 104 may be any dielectric material known in the art, such as, for example, an oxide or nitride. The insulator layer 104 may also be referred to as a buried dielectric layer or a buried oxide (BOX) layer.

The semiconductor layer 106 may be formed on the insulator layer 104 using any deposition technique known in the art, such as, for example, epitaxial growth, chemical vapor deposition (CVD), physical vapor deposition (PVD), or atomic layer deposition (ALD). The semiconductor layer 106 may be any semiconductor material known in the art, such as, for example, silicon, germanium, or SiGe. In an embodiment, the semiconductor layer 106 is $Si_{1-x}Ge_x$. The semiconductor layer 106 may have a thickness of about 10 nm to about 200 nm, but other thicknesses may be used. In an embodiment the semiconductor layer 106 has a thickness of about 35 nm. It should be noted, the semiconductor layer 106 may also be referred to as a SiGe layer.

Figure 2:
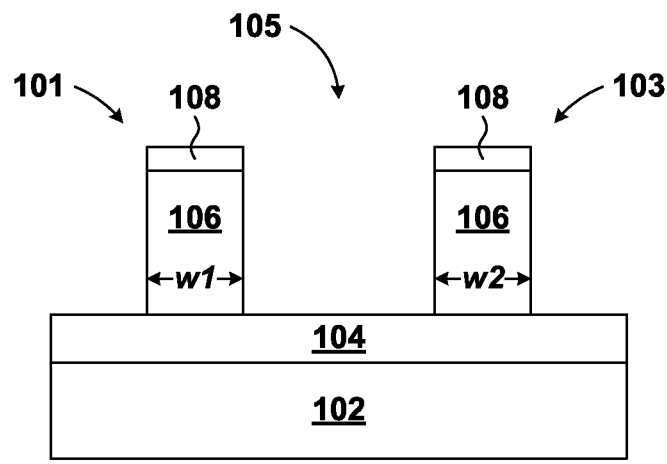
FIG. 2 is a cross section view of the semiconductor structure and illustrates the formation of a plurality of fins, according to an exemplary embodiment.

With reference to FIG. 2, a demonstrative illustration of the structure 100 is provided during an intermediate step of a method of fabricating a plurality of fins with a modulated germanium fraction, according to an embodiment. More specifically, the method can include forming a plurality of fins in the semiconductor layer 106.

The plurality of fins may be formed in the semiconductor layer 106 using any fin formation technique known in the art, such as, for example, a mask and etch technique. If a mask and etch technique is used, a hardmask 108 may be formed on the semiconductor layer 106 using any deposition technique known in the art, such as, for example, atomic layer deposition (ALD), molecular layer deposition (MLD), chemical vapor deposition (CVD), physical vapor deposition (PVD), or a spin on technique. The hardmask 108 may be any masking material known in the art, such as, for example, an oxide, nitride, or resist. In an embodiment, the hardmask 108 is $HfO_2$. The hardmask 108 may have a thickness ranging from about 5 nm to about 30 nm, but other thicknesses may be used. The hardmask 108 may be patterned using any patterning technique known in the art, such as photolithography.

A trench 105 may be formed through the semiconductor layer 106 and between the plurality of fins. The patterned hardmask 108 can protect the plurality of fins during the formation of the trench 105. The plurality of fins may include portions of the semiconductor layer 106 that is not removed during the formation of the trench 105. The trench 105 may expose a top surface of the insulator layer 104 around the fins and in between adjacent fins.

The plurality of fins may include a first fin 101 and a second fin 103 with similar characteristics. The first fin 101 may have a first width (w1) and the second fin 103 may have a second width (w2). The first width (w1) and the second width (w2) can range from about 10 nm to about 50 nm, but other widths may be used. The first width (w1) may be substantially similar to the second width (w2). In an embodiment, the first and second width (w1, w2) are each 20 nm.

Figure 3:
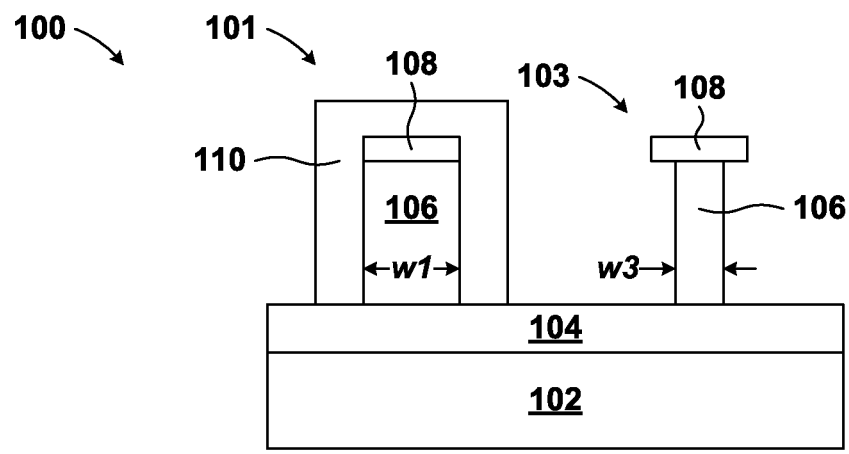
FIG. 3 is a cross section view of the semiconductor structure and illustrates the thinning of a second fin, according to an exemplary embodiment.

With reference to FIG. 3, a demonstrative illustration of the structure 100 is provided during an intermediate step of a method of fabricating a plurality of fins with a modulated germanium fraction, according to an embodiment. More specifically, the method can include thinning the second fin 103.

A first fin mask 110 may be used to protect the first fin 101 while thinning the second fin 103. The first fin mask 110 may be formed on the first fin 101 using any mask formation technique known in the art, such as, for example, conformally forming a dielectric layer or by a blanket deposition and etch process. The first fin mask 110 may be any masking material known in the art, such as, for example, a nitride or oxide. In an embodiment, the first fin mask 110 is a nitride.

The second fin 103 may be thinned using any etching technique known in the art, such as, for example, a wet or chemical etching process. A sidewall portion of the second fin 103 may be removed and a top surface of the second fin 103 may be protected by the hardmask 108. After the thinning step, the second fin 103 may have a third width (w3) that is less than the second width (w2). In an embodiment, about 2 nm may be removed from each side of the second fin 103, such that the third width (w3) is about 4 nm less than the second width (w2). After the second fin 103 is thinned, the first fin mask 110 may be removed. It should be noted, in the exemplary embodiment, the first and second fins 101, 103 have different widths (i.e., (w1) and (w3), respectively) but the first and second fins 101, 103 may have the same compound concentration (e.g., $Si_{1-x}Ge_x$).

Figure 4:
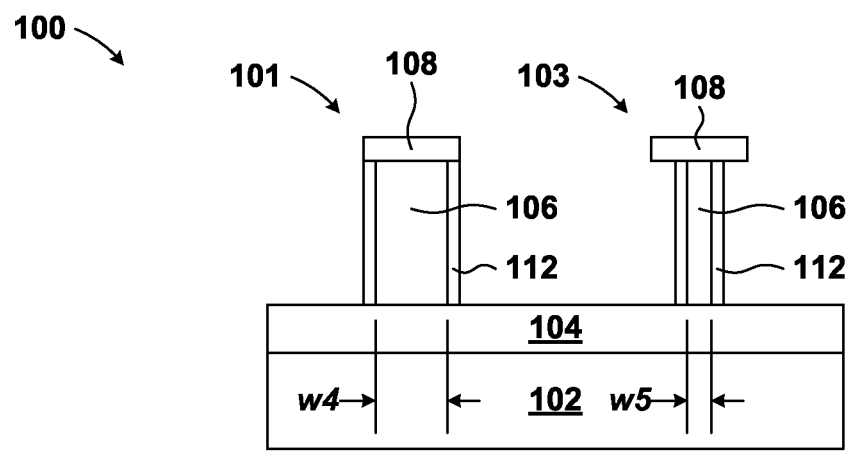
FIG. 4 is a cross section view of the semiconductor structure and illustrates the (3D) condensation of the plurality of fins, according to an exemplary embodiment.

With reference to FIG. 4, a demonstrative illustration of the structure 100 is provided during an intermediate step of a method of fabricating a plurality of fins with a modulated germanium fraction, according to an embodiment. More specifically, the method can include modulating the germanium fraction of the plurality of fins.

The germanium fraction may be modulated using, for example, a (3D) condensation process. The (3D) condensation process may include, for example, depositing an oxide on the plurality of fins followed by a thermal condensation technique/process (e.g., Ge-condensation). A Ge-condensation process may include condensing germanium atoms within the plurality of fins during the thermal condensation process, where silicon atoms in the semiconductor layer 106 are pulled into an oxide layer 112 which may form on fin sidewalls. The Ge-condensation process may be performed by oxidizing the structure 100 in $O_2$ atmosphere at a high temperature, such as, for example, above 1000° C. In an embodiment, the hardmask 108 protects the top of the plurality of fins and the oxide layer 112 can form on the sidewalls of the plurality of fins. In an embodiment, the oxide layer 112 is $SiO_2$.

The germanium fraction may depend on the fin width because a constant rate of Ge-condensation may result in a higher germanium fraction in thinner fins (e.g., the second fin 103) and a lower germanium fraction in thicker fins (e.g., the first fin 101). After the (3D) condensation process, the first fin 101 may be $Si_{1-y}Ge_y$ and the second fin 103 may be $Si_{1-z}Ge_z$, such that (z>y>x). The (3D) condensation process may consume a portion of the first and second fin 101, 103 resulting in a reduction of the first and third widths (w1, w3), such that the first fin 101 has a fourth width (w4) and the second fin 103 has a fifth width (w5). The fourth width (w4) may be less than the first width (w1) and greater than the fifth width (w5).

The hardmask 108 and the oxide layer 112 may be removed from the plurality of fins. Subsequent steps may be performed to form a device, such as, for example, a FinFET device, as is well known in the art.

In an embodiment, the first and second fins 101, 103 each have an initial fin width (FIG. 2) of 20 nm with a germanium fraction of 25%. After a 4 nm trim of the second fin 103, the first and second fins 101, 103 have a first and third width (w1, w3) equal to 20 nm and 16 nm, respectively. After the (3D) condensation process, the first and second fins 101, 103 have a fourth and fifth width (w4, w5) equal to 12 nm and 8 nm, respectively. The germanium fraction of the first and second fin 101, 103 after the (3D) condensation process are about 42% and 50%, respectively.

Figure 5:
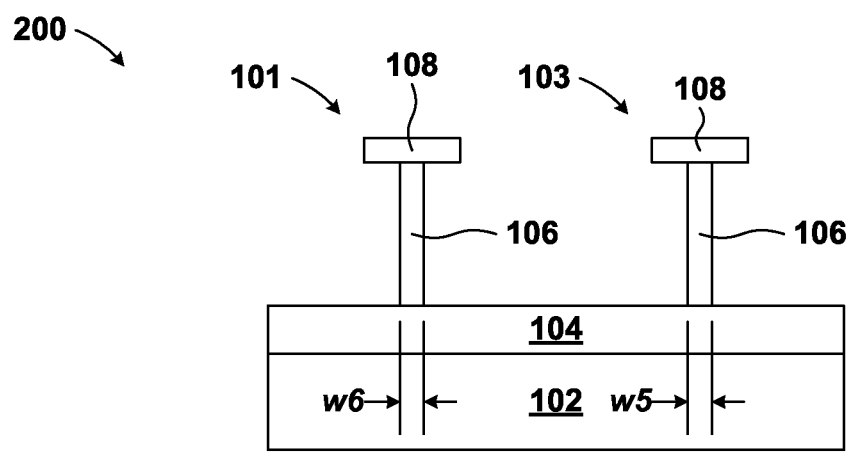
FIG. 5 is a cross section view of an alternative semiconductor structure and illustrates the thinning of a first fin, according to an exemplary embodiment.

With reference to FIG. 5, a demonstrative illustration of an alternative structure 200 is provided during an intermediate step of a method of fabricating a plurality of with a modulated germanium fraction, according to an embodiment. More specifically, the method can include thinning the first fin 101 to a sixth width (w6).

The first and second fin 101, 103 may have different germanium fractions and different threshold voltages; however, the first and second fin 101, 103 may also have different widths (e.g., (w4)>(w5)) and may have different short-channel effects. One way to adjust the different short-channel effects is to thin the first fin 101 to a sixth width (w6) which may be substantially similar to the fifth width (w5). The first fin 101 may be thinned using any etching technique known in the art, such as, for example, a wet or chemical etching process. The first fin 101 may be thinned in a similar process as the thinning step of the second fin 103.

One benefit to of forming two fins with different germanium fractions from a single semiconductor layer (e.g., the semiconductor layer 106) is to save cost and processing time. The two fins can be part of a semiconductor device, such as, for example, a tri-gate device. It may be beneficial to have fins with different germanium fractions (i.e., having different threshold voltages). Devices having high threshold voltages are suitable for low-power, while devices having low threshold voltages are suitable for high-speed. It is important for a technology to have devices with different voltages in order to meet the diverse range of requirements for speed and power consumption for various circuit blocks. However, to achieve different germanium fractions, different fin widths should be used. The different fin widths can result in different germanium fractions after a (3D) condensation process; however, the different fin widths can also result in different short-channel effects between the two devices, which would be undesirable. It is important to maintain similar short-channel effects between devices having different germanium fractions because both should be optimized. An optional thinning step of the larger fins may be performed, such that the plurality of fins have similar widths but different germanium fractions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   providing a silicon-germanium-on-insulator (SGOI) substrate, the SGOI substrate includes (from bottom to top) a substrate, an insulator layer, and a SiGe layer;
   forming a patterned hardmask on the SiGe layer;
   forming a plurality of fins in the SiGe layer by etching a trench through the SiGe layer, the trench exposes a top surface of the insulator layer, the patterned hardmask protects a top surface of the plurality of fins, the plurality of fins includes a first fin and a second fin, the first fin has a first width and the second fin has a second width, and the first width is similar to the second width;
   trimming the second fin to a third width by etching sidewalls of the second fin, the top of the second fin is protected by the patterned hardmask, and the first fin is protected by a first fin mask;
   modulating the germanium fraction of the first and second fin using a Ge-condensation process, the patterned hardmask protects the top surface of the plurality of fins, the first fin has a fourth width and the second fin has a fifth width, and the first fin has a lower germanium concentration than the second fin; and trimming the first fin to a sixth width, the sixth width is similar to the fifth width.

2. The method of claim 1, wherein the patterned hardmask is $HfO_2$.

3. The method of claim 1, wherein the Ge-condensation forms an oxide layer on sidewalls of the plurality of fins, and the oxide layer is $SiO_2$.

4. The method of claim 1, wherein the first width is 20 nm, the second width is 20 nm, the third width is 16 nm, the fourth width is 12 nm, and the fifth width is 8 nm.

5. The method of claim 1, wherein the first fin with the first width has a germanium fraction of 25 percent, the second fin with the second width has a germanium fraction of 25 percent, the second fin with the third width has a germanium fraction of 25 percent, the first fin with the fourth width has a germanium fraction of 42 percent, and the second fin with the fifth width has a germanium fraction of 50 percent.

6. The method of claim 1, wherein the first width and the second width are each greater than 10 nm.

7. A method comprising:
   forming a semiconductor-on-insulator (SOI) substrate, the SOI substrate includes (from bottom to top) a substrate, a buried oxide (BOX) layer, and a semiconductor layer;
   forming a plurality of fins in the semiconductor layer, the plurality of fins include a first fin and a second fin, the first fin has a first width and the second fin has a second width, the first fin has the same composition as the second fin, and a top surface of the plurality of fins is protected by a hardmask;
   thinning the second fin to a third width by removing a portion of the semiconductor layer from sidewalls of the second fin;
   condensing the plurality of fins using a (3D) condensation process, wherein the first fin has a different composition than the second fin, the top surface of the plurality of fins is protected by the hardmask, the first fin has a fourth width and the second fin has a fifth width, the fifth width is less than the third width; and
   thinning the first fin to a sixth width, the sixth width is similar to the fifth width.

8. The method of claim 7, wherein the semiconductor layer is SiGe.

9. The method of claim 7, wherein the hardmask is $HfO_2$.

10. The method of claim 7, wherein the (3D) condensation process is a Ge-condensation process.

11. The method of claim 7, wherein the (3D) condensation process forms an oxide layer on sidewalls of the plurality of fins, and the oxide layer is $SiO_2$.

12. The method of claim 7, wherein the first width is 20 nm, the second width is 20 nm, the third width is 16 nm, the fourth width is 12 nm and the fifth width is 8 nm.

13. The method of claim 7, wherein the first fin with the first width has a germanium fraction of 25 percent, the second fin with the second width has a germanium fraction of 25 percent, the second fin with the third width has a germanium fraction of 25 percent, the first fin with the fourth width has a germanium fraction of 42 percent, and the second fin with the fifth width has a germanium fraction of 50 percent.

14. The method of claim 7, wherein the first width and the second width are each greater than 10 nm.

15. A structure comprising:
   a plurality of SiGe fins on an insulator layer, the plurality of fins includes a first fin having a first fin width and a first germanium concentration and a second fin having a second fin width and a second germanium concentration, the first fin width is the same as the second fin width, the first germanium concentration is different than the second germanium concentration.

16. The structure of claim 15, further comprising:
   a hardmask on the plurality of fins, wherein the hardmask is an oxide.

* * * * *